United States Patent
Aoki et al.

(10) Patent No.: US 8,173,553 B2
(45) Date of Patent: May 8, 2012

(54) EPITAXIAL WAFER AND PRODUCTION METHOD THEREOF

(75) Inventors: Yoshiro Aoki, Tokyo (JP); Noashi Adachi, Tokyo (JP); Akihiko Endo, Tokyo (JP); Yoshihisa Nonogaki, Tokyo (JP)

(73) Assignee: Sumco Corporation, Tokyo (JP)

( * ) Notice: Subject to any disclaimer, the term of this patent is extended or adjusted under 35 U.S.C. 154(b) by 131 days.

(21) Appl. No.: 12/483,439

(22) Filed: Jun. 12, 2009

(65) Prior Publication Data

US 2009/0321874 A1 Dec. 31, 2009

(30) Foreign Application Priority Data

Jun. 19, 2008 (JP) ................................. 2008-161026

(51) Int. Cl.
*H01L 21/322* (2006.01)
(52) U.S. Cl. ................. 438/766; 438/423; 257/E21.563
(58) Field of Classification Search .................. 438/407, 438/480, 766, 423, 966; 257/E21.563
See application file for complete search history.

(56) References Cited

U.S. PATENT DOCUMENTS

| | | | |
|---|---|---|---|
| 6,846,727 B2 * | 1/2005 | Fogel et al. | 438/479 |
| 6,998,353 B2 * | 2/2006 | Erokhin et al. | 438/766 |
| 7,294,561 B2 * | 11/2007 | Erokhin et al. | 438/473 |
| 2007/0093072 A1 | 4/2007 | Fukuda et al. | |
| 2009/0205562 A1 | 8/2009 | Wada | |
| 2010/0052027 A1 * | 3/2010 | Abbott et al. | 257/306 |

FOREIGN PATENT DOCUMENTS

JP 2005-333052 12/2005

OTHER PUBLICATIONS

Wolf et al., "Silicon Processing for the VLSI Era, vol. 2—Process Integration", 1990, Lattice Press, pp. 72-75.*

* cited by examiner

*Primary Examiner* — Kenneth Parker
*Assistant Examiner* — Jose R Diaz
(74) *Attorney, Agent, or Firm* — Greenblum & Bernstein, P.L.C.

(57) ABSTRACT

A small amount of oxygen is ion-implanted in a wafer surface layer, and then heat treatment is performed so as to form an incomplete implanted oxide film in the surface layer. Thereby, wafer cost is reduced; a pit is prevented from forming in a surface of an epitaxial film; and a slip is prevented from forming in an external peripheral portion of a wafer.

6 Claims, 6 Drawing Sheets

EPITAXIAL WAFER AND PRODUCTION METHOD THEREOF

BACKGROUND OF THE INVENTION

1. Field of the Invention

Figure 1:
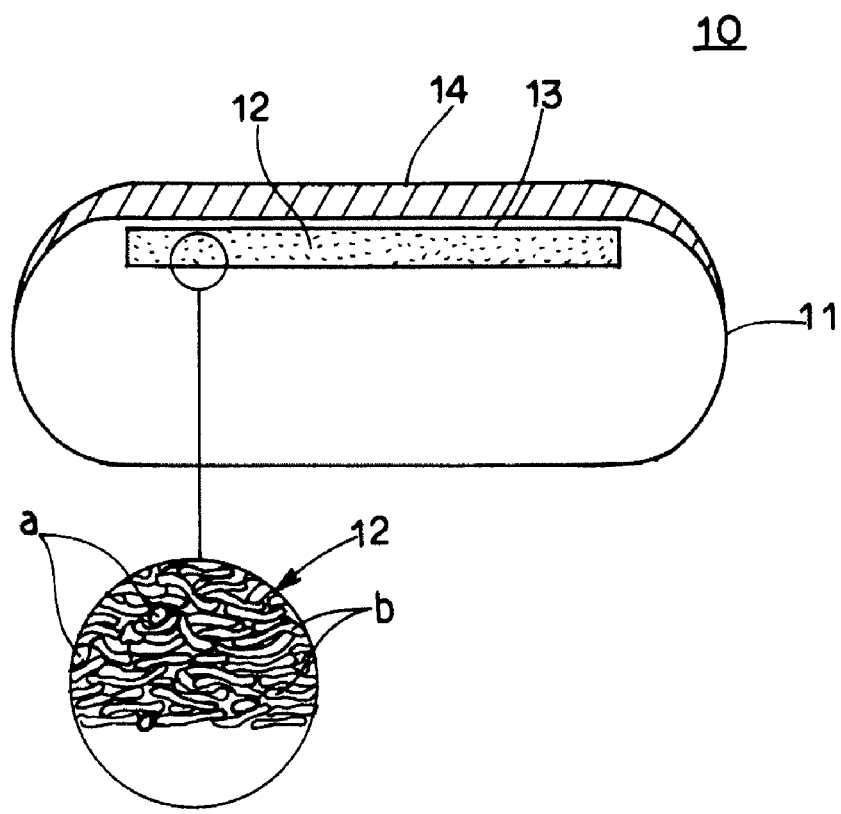

The present invention relates to an epitaxial wafer and a method of producing the same. More specifically, the present invention relates to an epitaxial wafer employing no silicon wafer having a complete SOI structure, allowing high-precision thinning of the epitaxial wafer, and achieving cost reduction. The present invention also relates to a method of producing the epitaxial wafer.

2. Description of the Related Art

A SOI (silicon on insulator) wafer is known, in which an implanted oxide film is formed in a surface layer of a silicon wafer, and thereby an active layer having monocrystalline silicon is formed on a wafer surface side of the implanted oxide film. Further, a SIMOX (Separation by IMplanted OXygen) wafer has been developed as one type of the SOI wafer. The SIMOX wafer is provided with an ion-implanted layer, which is formed by ion-implanting oxygen in the surface layer of the silicon wafer from the wafer surface. After the forming of the ion-implanted layer, the silicon wafer is heat-treated, and thereby the ion-implanted layer is provided as an implanted oxide film (implanted silicon oxide film).

An epitaxial SIMOX wafer, which is a SIMOX wafer having an epitaxial film grown on a surface thereof, is heavily used as a wafer for CIS (CMOS Image Sensor), which is one type of an image sensor (Patent Literature 1, for example). The image sensor is a device that captures image information by utilizing photosensitive characteristics of a semiconductor. CIS absorbs light that has captured an external image, and integrates photocharge using a photodiode, which is a light receiving element. A device is formed on the surface of the epitaxial SIMOX wafer for CIS in a device forming process. A silicon wafer is then attached to the surface of the epitaxial film. Subsequently, the SIMOX wafer is ground and polished, or etched, from a rear side thereof, and thus is reduced in the thickness. Thereby, a wafer is provided, in which a device is implanted on the rear side of the epitaxial film (a location sandwiched by the attached wafer).

Oxygen is ion-implanted herein under conditions of a temperature of 200° C. to 600° C.; an implantation energy of 20 keV to 220 keV; and an ion implantation amount of $1.5 \times 10^{17}$ atoms/cm$^2$ to $2 \times 10^{18}$ atoms/cm$^2$. The implanted oxide film is used as a polishing stopper or an etching stopper in a process in which the wafer is thinned from the silicon to the implanted oxide film. Material properties are capitalized on herein, including a difference in hardness between oxide silicon and silicon, which causes a change in polishing resistance of the wafer; and a difference in an etching rate between oxide silicon and silicon, relative to an etching solution, which causes a change in an etching speed.

[Patent Literature 1] Japanese Patent Laid-open Publication No. 2005-333052

As described above, the conventional CIS wafer has the SIMOX wafer as a main body and the oxygen ion implantation amount of $1.5 \times 10^{17}$ atoms/cm$^2$ to $2 \times 10^{18}$ atoms/cm$^2$. Thus, when ions are implanted presumptively when particles are deposited on the wafer surface, a defect occurs in which the implanted oxide film breaks in a portion associated with the particles. The defect causes a pit in the wafer surface when the ion-implanted layer is annealed at high temperature. Specifically, when the ion-implanted layer changes to the implanted oxide film in the high temperature annealing, a film thickness increases in a portion excluding the defective potion, along with oxidation of silicon. Accordingly, a pit is formed in the portion of the silicon wafer, the portion being associated with the defective portion. Consequently, a pit is formed in the surface of the epitaxial film at the time of epitaxial growth, thus causing an increase in surface detects of the epitaxial film. The problem occurs since the silicon grows in accordance with a shape of the wafer surface.

Further, when the epitaxial SIMOX wafer is produced, oxygen ions are not implanted in a chamfered portion (external peripheral portion) of the wafer. Thus, no implanted oxide film exists in the external peripheral portion of the wafer. Consequently, unevenness in temperature in the external peripheral portion of the wafer increases the thickness of the external peripheral portion of the wafer, which has no implanted oxide film, of the epitaxial film, thus forming a slip in the external peripheral portion of the wafer.

In addition, the conventional CIS wafer has the epitaxial film grown on the surface of the SIMOX wafer having the implanted oxide film. For the CIS wafer, it is thus required, according to a SIMOX wafer production method, that the ion-implanted layer be heat-treated at a high temperature of 1,300° C. or higher and that high temperature annealing be performed to form the implanted oxide film formed from a silicon oxide film. Consequently, expenses are increased for a high temperature annealing device, particularly for a SiC member, thus leading to a sharp increase in production cost of the epitaxial SIMOX wafer.

BRIEF SUMMARY OF THE INVENTION

As a result of diligent research, the inventors have found that all problems described above can be solved with an epitaxial wafer having an oxygen ion implantation amount less than a conventional amount and provided with an incomplete implanted oxide film, in which silicon particles and silicon oxides mixedly exist; and thus completed the present invention. A conventional epitaxial SIMOX wafer has an implanted oxide film (complete implanted oxide film) sequentially provided to an entire area of a wafer surface, excluding an external peripheral portion of the wafer.

The present invention prevents a surface defect from occurring in an epitaxial film, the surface defect being caused by particles deposited on a wafer surface at the time of oxygen ion implantation. The present invention also prevents a slip from forming in an external peripheral portion of the wafer, the slip being caused by unevenness in temperature in the external peripheral portion of the epitaxial film. In addition, the present invention is intended to provide an epitaxial wafer and a production method thereof, the epitaxial wafer having a gettering site of metal impurities and the like and capable of reducing wafer production cost.

The present invention relates to an epitaxial wafer including an epitaxial film grown on a surface of a silicon wafer; and an incomplete implanted oxide film formed in a surface layer of the silicon wafer, the incomplete implanted oxide film being mixedly provided with silicon particles and silicon oxides and being formed by ion-implanting oxygen from the surface of the silicon wafer and heat-treating the silicon wafer after the ion implantation.

The oxygen ion implantation amount is reduced, compared with a case of the implanted oxide film of the conventional epitaxial SIMOX wafer. The ion-implanted portion is heat-treated when a temperature is lower than conventional high temperature annealing, such as, for example, at the time of epitaxial growth. Thereby, the incomplete implanted oxide film is formed in the surface layer of the silicon wafer. Different from the case of the conventional implanted oxide film, in which silicon oxides are provided sequentially, the incomplete implanted oxide film thus hardly experiences an increase in oxide film thickness associated with silicon oxidation. Consequently, even when ions are implanted presumptively when particles are deposited on the wafer surface, and thus the oxide film breaks in the wafer surface layer, a pit can be prevented from forming in the wafer surface, and eventually from forming in a surface of the epitaxial film grown on the wafer surface. Thereby, a surface defect of the epitaxial film can be prevented, the surface defect being caused by deposition of particles on the wafer surface at the time of ion implantation. Further, the oxygen ion implantation amount is less compared with the epitaxial SIMOX wafer having the conventional implanted oxide film, and high temperature annealing is eliminated. Thus, cost can be reduced compared with the epitaxial SIMOX wafer.

In addition, the present epitaxial wafer causes no difference in a growth rate of the epitaxial film in the wafer surface at the time of epitaxial film growth, the difference being between in an area provided with the incomplete implanted oxide film and in an area of the external peripheral portion of the wafer. No difference is caused because of even temperature distribution. Different from the epitaxial SIMOX wafer having the conventional implanted oxide film, it is thus unlikely that the film thickness increases in the external peripheral portion of the epitaxial film, and thereby a slip can be prevented from forming in the external peripheral portion of the wafer. Further, the incomplete implanted oxide film also serves as a gettering site of metal impurities contained in the silicon wafer. Thus, the silicon wafer as well as a device can be prevented from metal contamination.

The epitaxial wafer is a different type wafer from the epitaxial SIMOX wafer in view of the presence of the implanted oxide film. Specifically, the epitaxial wafer is implanted in the surface layer thereof with the incomplete implanted oxide film, in lieu of the implanted oxide film. A monocrystalline silicon wafer can be employed as the silicon wafer. The surface of the silicon wafer is mirror-polished. A diameter of the silicon wafer is, for example, 200 mm, 300 mm, 450 mm, or the like.

The phrase "heat-treating the silicon wafer" refers to heat treatment at a temperature that allows the incomplete implanted oxide film to form in the surface layer of the silicon wafer (900° C. to 1,200° C.). For instance, heat treatment at the time of epitaxial film growth, heat treatment in a device process, and the like may be employed. The "surface layer of the silicon wafer" refers to a depth range of 0.05 µm to 0.5 µm from the surface of the silicon wafer. A depth of less than 0.05 µm increases surface defects of the silicon wafer. When the depth exceeds 0.5 µm, a commercially available ion implantation device can not be used, and a special implantation device having a larger ion implantation energy is required.

The "incomplete implanted oxide film" refers to an incomplete silicon oxide film implanted in the surface layer of the silicon wafer. Further, the "incomplete implanted oxide film" has silicon oxides and silicon particles mixed at a predetermined ratio, the silicon oxides including deposited oxides, zonal oxides, and the like formed from $SiO_x$ including $SiO_2$, the silicon particles being granulated silicon in the silicon wafer due to oxygen ion implantation. The incomplete silicon oxide film refers to a state in which a silicon oxide film is provided non-sequentially (intermittently) in an entire area of the ion-implanted layer. The incomplete implanted oxide film has a thickness of 0.05 µm to 0.5 µm. When the thickness is less than 0.05 µm, the film cannot function sufficiently as an end point detector at the time of thinning of the silicon wafer. When the thickness exceeds 0.5 µm, the oxygen ion implantation time is extended, thus causing reduction in productivity of the epitaxial wafer and leading to cost increase. The "surface side of a silicon wafer relative to the incomplete implanted oxide film" refers to a portion in the wafer surface layer between the incomplete implanted oxide film and the wafer surface.

The present invention relates to the epitaxial wafer, in which the incomplete implanted film is sequentially formed across an area in which oxygen is ion-implanted, of the silicon wafer, by ion-implanting the oxygen in the silicon wafer from the surface thereof, and then heat-treating the silicon wafer. The phrase "across an area in which oxygen is ion-implanted, of the silicon wafer" refers to an entirety of a flatness quality area, which does not include a wafer chamfered portion.

The present invention relates to a production method of an epitaxial wafer including implanting oxygen ions from a surface of a silicon wafer, and thus forming an ion-implanted layer in a surface layer of the silicon wafer; growing an epitaxial film on the surface of the silicon wafer immediately after the ion implantation; and concurrently heating the wafer in the epitaxial growth, and thus heat-treating the ion-implanted layer. Thereby, an incomplete implanted oxide film is formed, the incomplete implanted oxide film being mixedly provided with silicon particles and silicon oxides; and an active layer is formed on a surface side of the silicon wafer relative to the incomplete implanted oxide film.

At the time of ion implantation, a less amount of oxygen ions is implanted in the surface layer of the silicon wafer than the conventional epitaxial SIMOX wafer. Further, the ion-implanted layer is heat-treated concurrently with the epitaxial growth, which is performed at a lower temperature than high temperature annealing of the epitaxial SIMOX wafer. Thereby, the incomplete implanted oxide film is formed in the surface layer of the silicon wafer. Unlike the conventional implanted oxide film, which does not contain silicon particles and is sequentially provided with silicon oxides, the film thickness of the incomplete implanted oxide film thus hardly increases along with oxidation of silicon.

Consequently, even when ions are implanted presumptively when particles are deposited on the wafer surface, and thus the oxide film breaks in the wafer surface layer, a pit can be prevented from forming in the wafer surface, and eventually from forming in the surface of the epitaxial film grown on the wafer surface. Thereby, a surface defect of the epitaxial film can be prevented, the surface defect being caused by deposition of particles on the wafer surface at the time of oxygen ion implantation. Further, the oxygen ion implantation amount is less compared with the epitaxial SIMOX wafer having the conventional implanted oxide film, and high temperature annealing is eliminated. Since no high temperature annealing device is required, cost can be reduced compared with the epitaxial SIMOX wafer.

In addition, unlike the conventional wafer, no difference is caused in the growth rate of the epitaxial film in the wafer surface at the time of epitaxial growth, the difference being between in the area provided with the implanted oxide film and in the remaining area of the external peripheral portion of the wafer. Different from the epitaxial SIMOX wafer having the conventional implanted oxide film, it is thus unlikely that the film thickness increases in the external peripheral portion of the epitaxial film, and thereby a slip can be prevented from forming in the external peripheral portion of the wafer. Further, the incomplete implanted oxide film also serves as a gettering site of metal impurities contained in the silicon wafer. Thus, the silicon wafer as well as a device can be prevented from metal contamination.

The ion implantation may be performed in any ion implantation method of a SIMOX process, including a low energy method (100 keV or less), a low dose method, and a modified low dose method. In any method employed, it is preferable that the oxygen ion implantation amount be 50% to 80% of that in the associated SIMOX process. A heating temperature of the wafer at the time of oxygen ion implantation is 200° C. to 600° C., for example. When the temperature is less than 200° C., large oxygen implantation damage remains in the surface layer of the silicon wafer. When the temperature exceeds 600° C., an outgassing amount from an ion implantation device increases.

An oxygen implantation energy is 20 keV to 220 keV. When the implantation energy is less than 20 keV, surface defects of the silicon wafer increase. When the implantation energy exceeds 220 keV, a commercially available ion implantation device can not be used, and a special implantation device having a larger ion implantation energy is required. An oxygen ion implantation amount is $1 \times 10^{15}$ atoms/cm$^2$ to $4 \times 10^{17}$ atoms/cm$^2$. When the implantation amount is less than $1 \times 10^{15}$ atoms/cm$^2$, the film cannot function sufficiently as an end point detector at the time of thinning of the silicon wafer. When the implantation amount exceeds $4 \times 10^{17}$ atoms/cm$^2$, the oxygen ion implantation time is extended, thus causing reduction in productivity of the epitaxial wafer and leading to cost increase. An oxygen ion implantation depth is 0.05 μm to 0.5 μm. The oxygen ion implantation may be performed only once or for a plurality of times. Further, oxygen ions may be implanted at a plurality of implantation energies.

The phrase "immediately after the ion implantation" refers to no other heat treatment process provided between the ion implantation and the subsequent epitaxial growth. Monocrystalline silicon can be used as material of the epitaxial film formed in the epitaxial growth. Types of epitaxial growth generally include vapor phase epitaxy (VPE), liquid phase epitaxy (LPE), and solid phase epitaxy (SPE). For silicon epitaxial growth in particular, a chemical vapor deposition (CVD) method is mainly employed in view of crystallinity of a growth layer, mass production capability, ease of machine use, simplicity of structure forming of a variety of devices, and the like.

In the CVD method for silicon epitaxial growth, for example, a source gas containing silicon is introduced into a reactor along with a carrier gas (normally, H$_2$ gas); and silicon, which is produced in pyrolysis or reduction of the source gas, is deposited on a silicon monocrystalline substrate (produced based on a CZ method) heated to a temperature of 1,000° C. or higher. Among numerous compounds containing silicon, four types including SiH$_4$, SiH$_2$Cl$_2$, SiHCl$_3$, and SiCl$_4$ are generally used in light of purity, reaction speed, ease of handling, and the like. Examples of an epitaxial growth furnace to be used may include, for example, a radio frequency induction heating furnace, a lamp heating furnace, and the like. A thickness of the epitaxial film is 1 μm to 20 μm. When the thickness is less than 1 μm, a device cannot be formed on the epitaxial film. When the thickness exceeds 20 μm, productivity of the epitaxial wafer reduces, thus incurring cost increase.

An epitaxial growth temperature (wafer heat treatment temperature) is 1,000° C. to 1,200° C. When the temperature is less than 1,000° C., crystallinity of the epitaxial film is deteriorated. When the temperature exceeds 1,200° C., a slip is likely to form in the external peripheral portion of the wafer. An epitaxial growth time (wafer heat-treatment time) is 1 to 20 minutes. When the time is less than 1 minute, a predetermined epitaxial film cannot be obtained. When the time exceeds 20 minutes, a slip is likely to form in the external peripheral portion of the wafer.

The present invention relates to a production method of an epitaxial wafer including implanting oxygen ions from a surface of a silicon wafer, and thus forming an ion-implanted layer in a surface layer of the silicon wafer; heat-treating the ion-implanted layer immediately after the ion implantation, and thereby forming an incomplete implanted oxide film mixedly provided with silicon particles and silicon oxides, and an active layer on a surface side of the silicon wafer relative to the incomplete implanted oxide film; and growing an epitaxial film on the surface of the silicon wafer immediately after the heat treatment.

In the ion implantation, a less amount of oxygen ions is implanted in the surface layer of the silicon wafer than the conventional epitaxial SIMOX wafer. In the heat treatment of the ion-implanted layer, annealing is performed at a lower temperature than high temperature annealing of the epitaxial SIMOX wafer. Thereby, the incomplete implanted oxide film is formed in the surface layer of the silicon wafer. Unlike the conventional implanted oxide film, the film thickness of the incomplete implanted oxide film thus hardly increases along with oxidation of silicon.

Consequently, even when ions are implanted presumptively when particles are deposited on the wafer surface, and thus the oxide film breaks in the wafer surface layer, a pit can be prevented from forming in the wafer surface, and eventually from forming in the surface of the epitaxial film grown on the wafer surface. Thereby, a surface defect of the epitaxial film can be prevented, the surface defect being caused by deposition of particles on the wafer surface at the time of oxygen ion implantation. Further, the oxygen ion implantation amount is less compared with the epitaxial SIMOX wafer having the conventional implanted oxide film, and high temperature annealing is eliminated. Since no SiC member for high temperature annealing is required, cost can be reduced compared with the epitaxial SIMOX wafer. Annealing is performed immediately after the ion implantation, and the epitaxial growth is performed subsequently. Thereby, oxygen deposited in the annealing serves as a gettering site, thus allowing production of a high quality epitaxial film.

In addition, unlike the conventional wafer, no difference is caused in the growth rate of the epitaxial film in the wafer surface at the time of epitaxial growth, the difference being between in the area provided with the implanted oxide film and in the remaining area of the external peripheral portion of the wafer. Different from the epitaxial SIMOX wafer having the conventional implanted oxide film, it is thus unlikely that the film thickness increases in the external peripheral portion of the epitaxial film. Thereby, a slip, which is caused by unevenness in temperature, can be prevented from forming in the external peripheral portion of the wafer. Further, the incomplete implanted oxide film also serves as a gettering site of metal impurities contained in the silicon wafer. Thus, the silicon wafer as well as a device can be prevented from metal contamination.

A wafer heating temperature in the annealing for forming the incomplete implanted oxide film is 900° C. to 1,200° C. When the temperature is less than 900° C., an oxygen deposition amount is low. When the temperature exceeds 1,200° C., a special annealing furnace is required for ultra-high temperature annealing. A wafer heat-treatment time in the annealing is 0.5 to 4 hours. When the time is less than 0.5 hour, the oxygen deposition amount is low. When the time exceeds 4 hours, productivity of the epitaxial wafer reduces, thus incurring cost increase.

The present invention relates to a production method of an epitaxial wafer including implanting oxygen ions from a surface of a silicon wafer, and thus forming an ion-implanted layer in a surface layer of the silicon wafer; growing an epitaxial film on the surface of the silicon wafer immediately after the ion implantation; and heat-treating the ion-implanted layer immediately after the epitaxial growth, and thereby forming an incomplete implanted oxide film mixedly provided with silicon particles and silicon oxides, and an active layer on a surface side of the silicon wafer relative to the incomplete implanted oxide film.

The annealing is performed after the epitaxial growth (including heat treatment in a device process). The epitaxial film can thus be produced having a low oxygen deposition amount and a small surface roughness, compared with a case in which epitaxial growth is performed after annealing. The wafer heating temperature and heat-treatment time in the annealing are the same as in claim 4.

The present invention relates to the production method of the epitaxial wafer, in which the ion implantation is performed at a heating temperature of the silicon wafer of 200° C. or higher and an oxygen ion implantation amount of $1\times10^{15}$ atoms/cm$^2$ to $4\times10^{17}$ atoms/cm$^2$.

When the wafer heating temperature in the ion implantation is less than 200° C., damage at the time of oxygen implantation remains in the wafer surface layer. A preferable heating temperature in the ion implantation is 300° C. to 600° C. When the ion implantation is performed at a low temperature of 200° C. to 300° C., an effect can be obtained in which an oxygen deposition amount is increased. The similar effect is obtained in a case in which the ion implantation is performed twice as described in claim 7. When the oxygen ion implantation amount in the ion implantation is less than $1\times10^{15}$ atoms/cm$^2$, the film cannot function sufficiently as an end point detector at the time of thinning of the silicon wafer. When the implantation amount exceeds $4\times10^{17}$ atoms/cm$^2$, the oxygen ion implantation time is extended, thus causing reduction in productivity of the epitaxial wafer and leading to cost increase.

The present invention relates to the production method of the epitaxial wafer, in which the ion implantation includes ion-implanting oxygen in the surface layer of the silicon wafer at a heating temperature of the silicon wafer of 200° C. or higher and an oxygen ion implantation amount of $1\times10^{15}$ atoms/cm$^2$ to $4\times10^{17}$ atoms/cm$^2$, and thereby forming an oxygen ion-implanted layer; and ion-implanting oxygen on the wafer surface side of the oxygen ion-implanted layer after the forming of the ion-implanted layer, at a heating temperature of the silicon wafer of less than 200° C. and an oxygen ion implantation amount of $1\times10^{15}$ atoms/cm$^2$ to $4\times10^{16}$ atoms/cm$^2$, and thereby forming an amorphous layer.

In the ion implantation for the first time (first ion implantation), oxygen is ion-implanted in the surface layer of the silicon wafer at the temperature of 200° C. or higher and the oxygen ion implantation amount of $1\times10^{15}$ atoms/cm$^2$ to $4\times10^{17}$ atoms/cm$^2$. Thereby, the oxygen ion-implanted layer is formed in the wafer surface layer. In the subsequent ion implantation for the second time (second ion implantation), the amorphous layer is formed on the wafer surface side of the oxygen ion-implanted layer at the temperature of less than 200° C. and the oxygen ion implantation amount of $1\times10^{15}$ atoms/cm$^2$ to $4\times10^{16}$ atoms/cm$^2$. Thereafter, epitaxial growth is performed on the silicon wafer, and thereby a sequentially stacked two-layered incomplete implanted oxide film is formed in the wafer surface layer. Under the ion implantation conditions, the incomplete implanted oxide film does not only include the ion-implanted layer, but also the amorphous layer as a part of a structured body. Thereby, the amorphous layer increases the oxygen deposition amount.

A vertical placement of the oxygen ion-implanted layer and the amorphous layer may be flexible. The oxygen ion-implanted layer may be provided upper or lower to the amorphous layer. Since damage is formed more on the wafer surface layer side than on the oxygen ion-implanted layer, however, the amorphous layer is generally provided as an upper layer. In the second ion implantation, oxygen ions are implanted to a depth substantially same as the oxygen ion-implanted layer of the wafer surface layer.

A thickness of the oxygen ion-implanted layer is 0.025 μm to 0.25 μm. When the thickness is less than 0.025 μm, the film cannot function sufficiently as an end point detector at the time of thinning of the silicon wafer. When the thickness exceeds 0.25 μm, the oxygen ion implantation time is extended, thus causing reduction in productivity of the epitaxial wafer and leading to cost increase. A thickness of the amorphous layer is 0.025 μm to 0.25 μm. When the thickness is less than 0.025 μm, the film cannot function sufficiently as an end point detector at the time of thinning of the silicon wafer. When the thickness exceeds 0.25 μm, the oxygen ion implantation time is extended, thus causing reduction in productivity of the epitaxial wafer and leading to cost increase.

The oxygen ion implantation in the silicon wafer surface layer herein is performed in a modified low dose method (MLD) of the SIMOX wafer. The modified low dose method performs the last oxygen ion implantation at a low dosage at proximate ambient temperature in the low dose SIMOX method, so as to form an amorphous layer; and thereby allows a buried oxide layer to be formed at a lower dose. When the silicon wafer heating temperature in the first ion implantation is less than 200° C., damage at the time of oxygen implantation remains in the wafer surface layer. A preferable heating temperature in the first ion implantation is 300° C. to 600° C. When the oxygen ion implantation amount in the first ion implantation is less than $1\times10^{15}$ atoms/cm$^2$, the film cannot function sufficiently as an end point detector at the time of thinning of the silicon wafer. When the implantation amount exceeds $4\times10^{17}$ atoms/cm$^2$, the oxygen ion implantation time is extended, thus causing reduction in productivity of the epitaxial wafer and leading to cost increase.

When the silicon wafer heating temperature in the second ion implantation exceeds 200° C., the amorphous layer is not formed due to insufficient damage in the wafer surface layer at the time of ion implantation. A preferable heating temperature in the second ion implantation is an ambient temperature to 100° C. Within the range, ion implantation damage can be caused that enables the amorphous layer to be formed in the wafer surface layer. When the oxygen ion implantation amount in the second ion implantation is less than $1.0\times10^{15}$ atoms/cm$^2$, the amorphous layer is not formed due to insufficient damage in the wafer surface layer at the time of ion implantation. When the implantation amount exceeds $4\times10^{16}$ atoms/cm$^2$, the oxygen ion implantation time is extended, thus causing reduction in productivity of the epitaxial wafer and leading to cost increase. An epitaxial growth temperature is 1,000° C. to 1,200° C. When the temperature is less than 1,000° C., crystallinity of the epitaxial film is deteriorated. When the temperature exceeds 1,200° C., a slip is likely to form in the external peripheral portion of the wafer.

The present invention relates to the production method of the epitaxial wafer, in which the heat treatment is performed at a heating temperature of the silicon wafer of 900° C. to 1,200° C. and a heating time of 0.5 to 4 hours.

When the annealing temperature is less than 900° C., an oxygen deposition amount is low in the area in which oxygen is ion-implanted. When the temperature exceeds 1,200° C., a special annealing furnace is required for ultra-high temperature annealing. When the annealing time is less than 0.5 hour, the oxygen deposition amount is low in the area in which oxygen is ion-implanted. When the time exceeds 4 hours, productivity of the epitaxial wafer reduces, thus incurring cost increase.

BRIEF DESCRIPTION OF THE SEVERAL
VIEWS OF THE DRAWINGS

Figure 2:
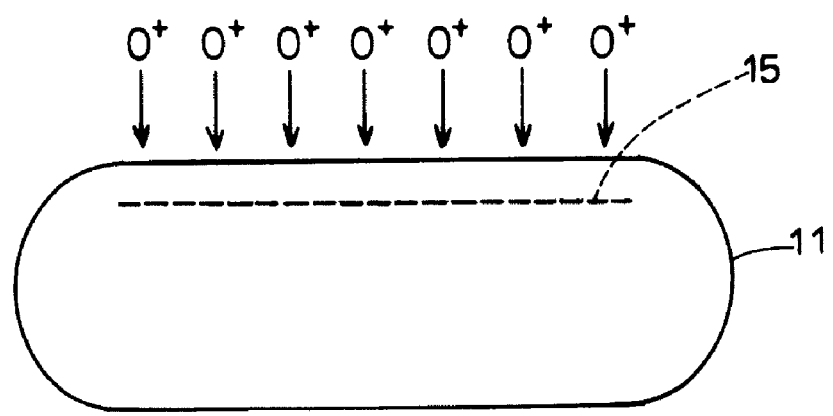
Figure 3:
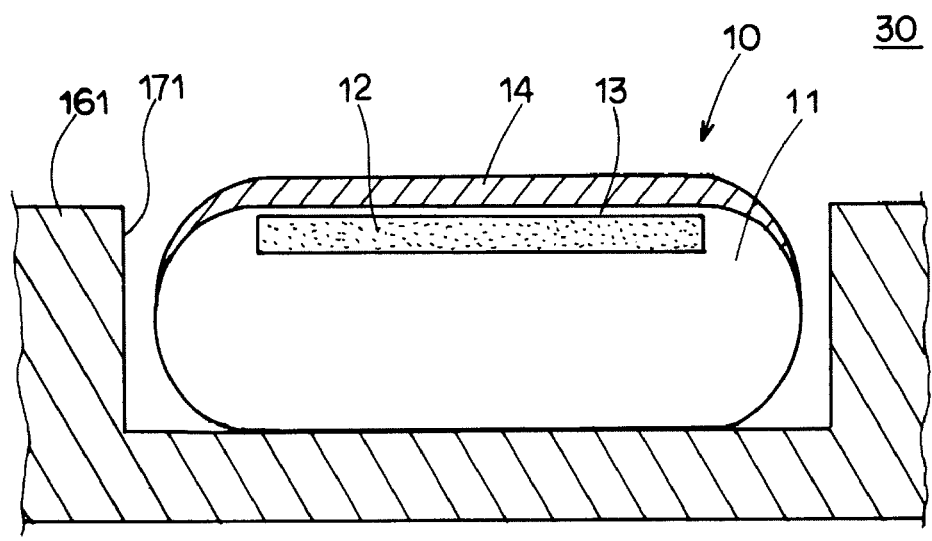
Figure 4:
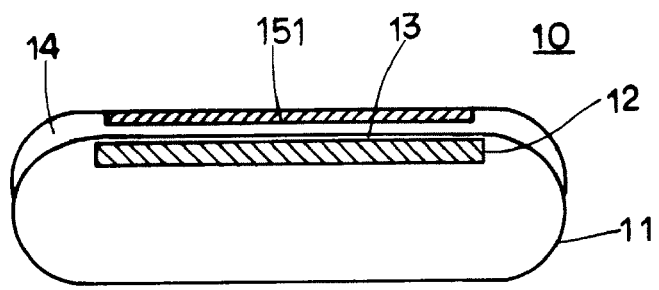
Figure 5:
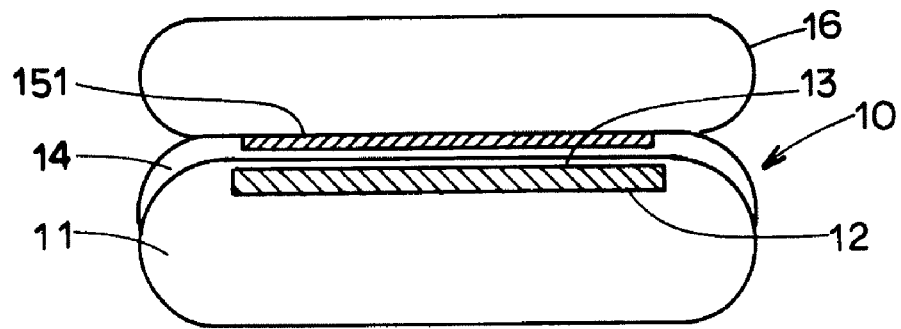
Figure 6:
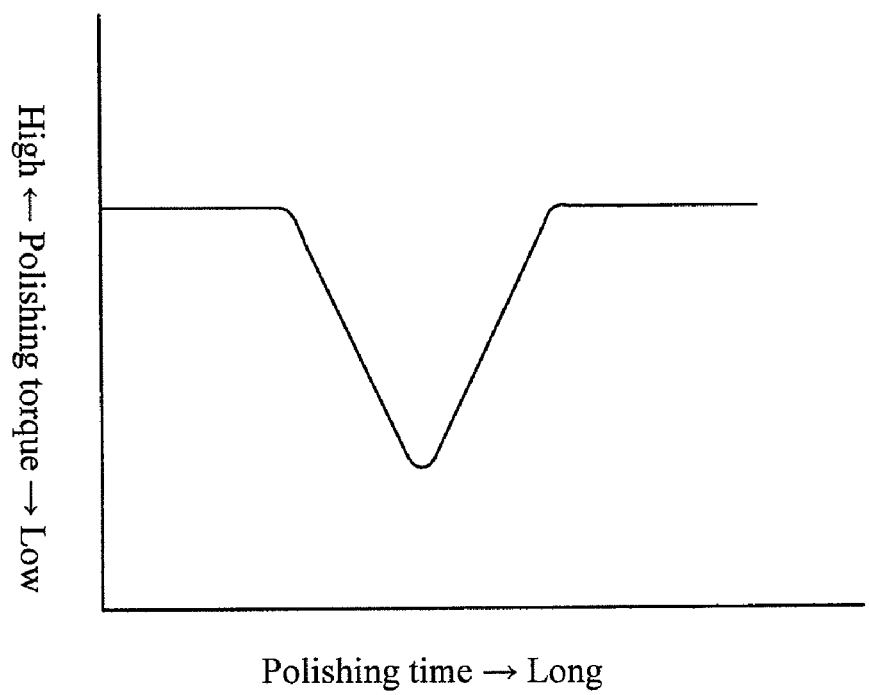
Figure 7:
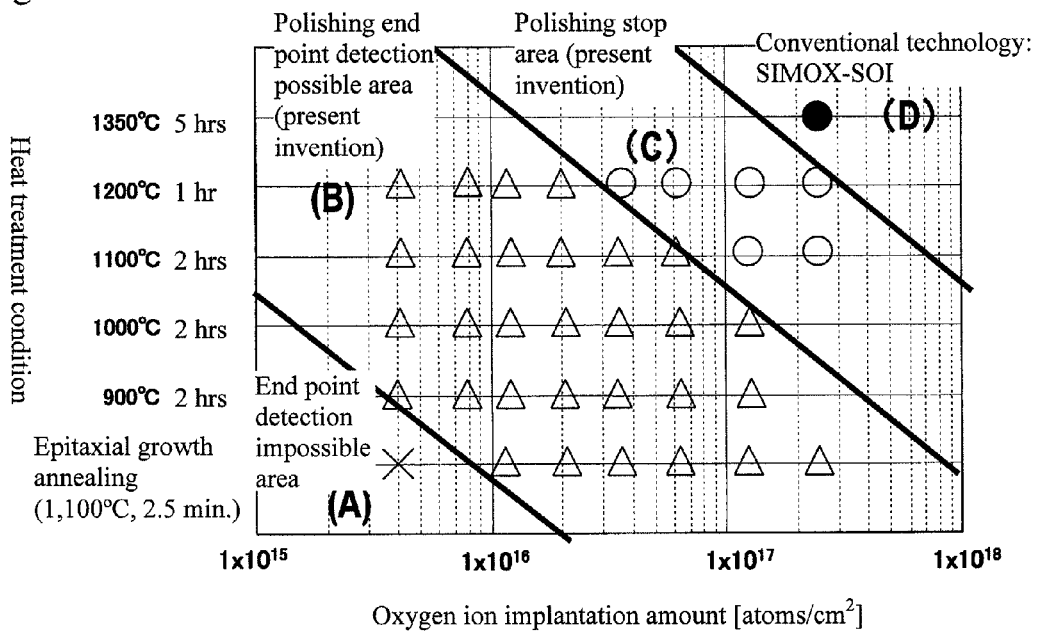
Figure 8:
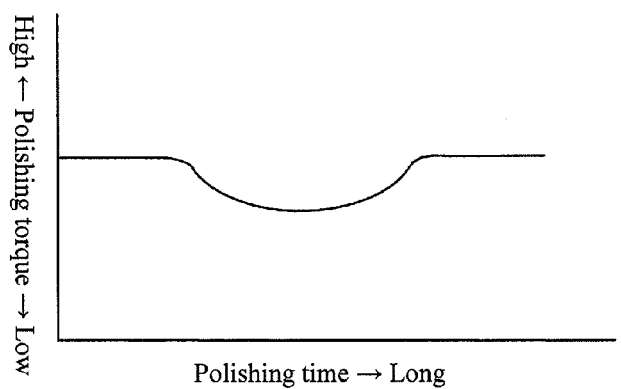
Figure 9:
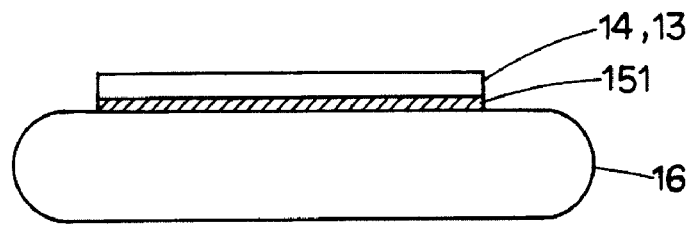
Figure 10:
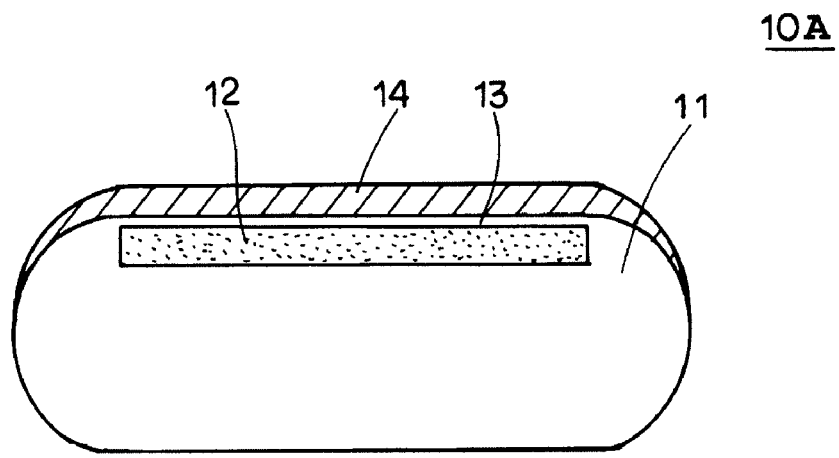
Figure 11:
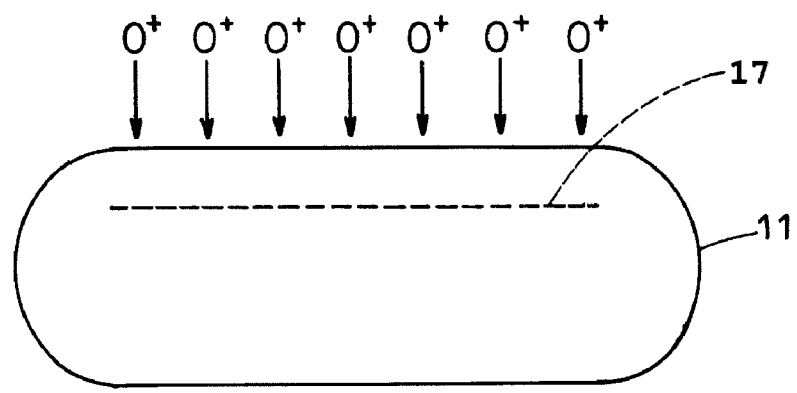
Figure 12:
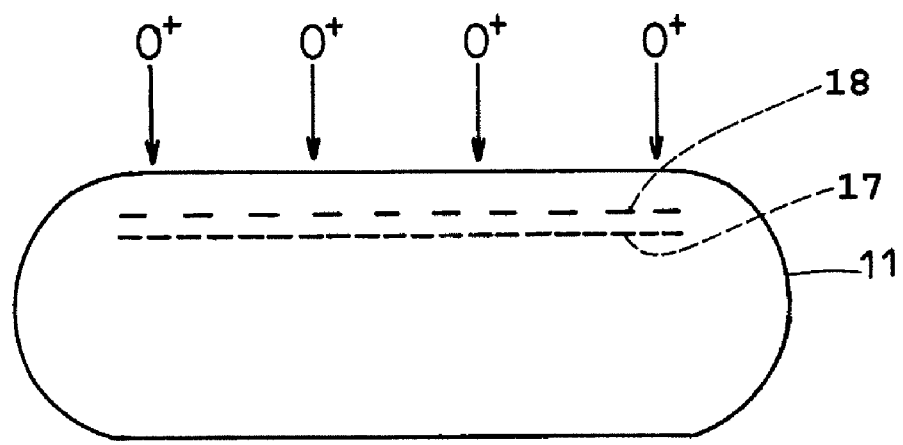

FIG. 1 A cross-sectional view including a partial enlarged view of an epitaxial wafer according to a first embodiment of the present invention FIG. 2 A cross-sectional view illustrating an ion implantation process in a production method of the epitaxial wafer according to the first embodiment of the present invention FIG. 3 A cross-sectional view illustrating an epitaxial growth process in the production method of the epitaxial wafer according to the first embodiment of the present invention FIG. 4 A cross-sectional view illustrating a device forming process in the production method of the epitaxial wafer according to the first embodiment of the present invention FIG. 5 A cross-sectional view illustrating a wafer bonding process in the production method of the epitaxial wafer according to the first embodiment of the present invention FIG. 6 A graph illustrating change in polishing torque when a polishing cloth comes in contact with an incomplete oxide film in surface polishing of the epitaxial wafer according to the first embodiment of the present invention FIG. 7 A graph illustrating a relationship between an oxygen ion implantation amount in a silicon wafer and a heat treatment condition in the production method of the epitaxial wafer according to the first embodiment of the present invention FIG. 8 A graph illustrating change in polishing torque when a polishing cloth comes in contact with an insufficient incomplete oxide film in surface polishing of the epitaxial wafer according to the first embodiment of the present invention FIG. 9 A cross-sectional view illustrating a thinning process in the production method of the epitaxial wafer according to the first embodiment of the present invention FIG. 10 A cross-sectional view of an epitaxial wafer according to a second embodiment of the present invention FIG. 11 A cross-sectional view illustrating a first ion implantation process in a production method of the epitaxial wafer according to the second embodiment of the present invention FIG. 12 A cross-sectional view illustrating a second ion implantation process in the production method of the epitaxial wafer according to the second embodiment of the present invention

DETAILED DESCRIPTION OF THE INVENTION

An epitaxial wafer according to a first embodiment of the present invention and a production method of the same are explained below. A CIS epitaxial wafer is used herein as an example.

In order to produce an epitaxial wafer 10, which is an epitaxial wafer according to the first embodiment of the present invention, as shown in FIGS. 1 to 6, oxygen is first ion-implanted in a silicon wafer 11 from a surface thereof. Thereafter, the silicon wafer 11 is heat-treated, and then an incomplete implanted oxide film 12 is formed in a surface layer of the silicon wafer 11, the incomplete implanted oxide film 12 being mixedly provided with silicon particles a and silicon oxides b. Thereby, an active layer 13 is formed on a surface side of the silicon wafer 11 relative to the incomplete implanted oxide film 12, and an epitaxial film 14 is grown on the surface of the silicon wafer 11.

The epitaxial wafer 10 is explained in detail below. The silicon wafer 11 has a thickness of 775 μm, a diameter of 300 mm, and an axis direction of a main surface is <100>. The silicon wafer 11 is produced by sequentially performing processes below. Specifically, a silicon monocrystalline body is pulled from a melt of silicon in a crucible in a CZ method; subsequently, the silicon monocrystalline body is cut into blocks, which are ground on an external periphery, and then sliced into numerous wafer slices by a wire saw. Subsequently, each of the wafer slices is chamfered, lapped, etched, polished, and washed.

An ion implantation process (FIG. 2) is then performed, in which the resultant silicon wafer 11 is implanted with oxygen ions from the surface of the silicon wafer 11, and thus an ion-implanted layer 15 is formed in the surface layer of the silicon wafer 11. Immediately after the ion implantation process, the silicon wafer 11 is inserted into a chamber (epitaxial growth furnace) 30 of an epitaxial growth device, and thus the epitaxial film 14 is grown on the surface of the silicon wafer 11. Concurrently, the ion-implanted layer 15 is heat-treated, and thereby the incomplete implanted oxide film 12 is formed in the wafer surface layer, the incomplete implanted oxide film 12 being mixedly provided with the silicone particles a and the silicone oxides b. Further, an epitaxial growth process (FIG. 3) is sequentially performed, in which the active layer 13 is formed on the surface side of the silicon wafer 11 relative to the incomplete implanted oxide film 12.

In the ion implantation process, the silicon wafer 11 is inserted into an ion implantation device. Oxygen is then ion-implanted in the surface layer of the silicon wafer 11 from the wafer surface at a wafer heating temperature of 400° C., an implantation energy of 50 keV, and an implantation amount of $1.5 \times 10^{17}$ atoms/cm². Thereby, the ion-implanted layer 15 is formed at a depth of 0.1 μm from the surface of the silicon wafer 11, the ion-implanted layer 15 having low grade oxides, such as SiO, $Si_2O_3$, and the like.

In the epitaxial growth process, the silicon wafer 11 is placed in a reactor of a sheet-fed vapor phase epitaxial growth device, whereby the epitaxial film 14 is grown on the surface of the silicon wafer 11 in a vapor phase epitaxial method. The vapor phase epitaxial growth device has a susceptor 161 placed horizontally in a middle portion of the chamber 30, the susceptor 161 having a circular shape from a plan view, the chamber 30 being provided with heaters at vertical positions. A recess-shaped wafer housing 171 is provided in a middle portion of a surface of the susceptor 161, the wafer housing 171 housing the silicon wafer 11 having front and rear surfaces in a horizontal state. A pair of gas supply inlets are provided in one side portion of the chamber 30, the gas supply inlets flowing a predetermined carrier gas ($H_2$ gas) and a predetermined source gas ($SiHCl_3$ gas) in parallel with the wafer surface in an upper space of the chamber 30. Further, a gas discharge outlet of the both gases is provided on the other side portion of the chamber 30.

At the time of the epitaxial growth, the silicon wafer 11 is first placed in the wafer housing 171 of the susceptor 161, such that the front and rear surfaces of the wafer are provided horizontally. Subsequently, the carrier gas and the source gas are supplied to the reactor through the associated gas supply inlets. A reactor inside pressure is set to 0.1 KPa. Silicon, which is produced in pyrolysis or reduction of the source gas, is deposited at a reaction rate of 2 μm/minute on the silicon wafer 11 heated to a high temperature of 1,100° C. Thereby, the silicon monocrystalline epitaxial film 14 having a thickness of 5 μm is grown on the surface of the silicon wafer 11.

Concurrently, the ion-implanted layer 15 is heat-treated as the wafer is heated at the time of the epitaxial growth. Thereby, the incomplete implanted oxide film 12 is formed having the silicon oxides b and the silicon particles a mixed at a predetermined proportion, the silicon oxides b including deposited oxides, zonal oxides, and the like formed from $SiO_x$ including $SiO_2$, the silicon particles a being granulated silicon in the silicon wafer 11 due to oxygen ion implantation. The incomplete implanted oxide film 12 has a thickness of 0.1 μm. In addition, the active layer 13 having a thickness of 0.05 μm is formed on the surface side of the silicon wafer 11 relative to the incomplete implanted oxide film 12. Since the active layer 13 and the epitaxial film 14 are formed from the same silicon, the active layer 13 and the epitaxial film 14 are integrated. Thereby, the epitaxial wafer 10 is produced.

The resultant epitaxial wafer 10 is then transferred to a device forming process. In the process, a predetermined photo process is performed on the surface of the epitaxial film 14, and thus a device 151 is formed (FIG. 4). Thereafter, the silicon wafer 11 having a diameter of 300 mm and a thickness of 775 μm is attached to the surface of the epitaxial film 14 (FIG. 5). The rear side of the epitaxial wafer 10 is then ground, polished, and reduced in the thickness. In the process, the incomplete implanted oxide film 12 functions as an oxide layer that selectively removes the epitaxial wafer 10. Specifically, when the thinning of the wafer proceeds to the incomplete implanted oxide film 12, the incomplete implanted oxide film 12 serves as a polishing stopper. When the surface polishing of the wafer reaches the silicon oxides, a polishing cloth slips as it comes in contact with the incomplete implanted oxide film 12. At the time, polishing torque of a polisher is reduced. Detecting the reduced polishing torque allows detection of the time to stop polishing (a graph in FIG. 6).

A graph of FIG. 7 shows an oxygen ion implantation condition for forming the incomplete implanted oxide film 12 and an annealing condition of the silicon wafer 11. In the graph of FIG. 7, an area of the condition for forming the incomplete implanted oxide film 12 is indicated with areas B and C. In area A, a reduction in polishing torque cannot be clearly detected, since the incomplete implanted oxide film 12 is not sufficiently formed, as shown in a graph of FIG. 8. Area D indicates an area of a complete implanted oxide film formed on the conventional epitaxial SIMOX wafer.

In the thinning of the wafer, etching may be employed in lieu of grinding and polishing of the epitaxial wafer 10. In this case, the incomplete implanted oxide film 12 functions as an etching stopper. Etching may be performed in a wet etching or dry etching method. When an $HF/HNO_3/CH_3COOH$ solution or an alkaline solution (KOH, for example) is used in the wet etching method, an etching rate is reduced at the time when etching reaches the incomplete implanted oxide film 12 from the silicon wafer 11. The etching rate is reduced because the rate is different between silicon and silicon oxides due to material properties. The film thickness needs to be monitored, however, since the stop function of the incomplete implanted oxide film 12 in wet etching is not perfect.

Examples of dry etching include a method in which material is aerated in a reaction gas (reactive gas etching), a reactive ion etching method in which a gas is ionized or radicalized by plasma, and the like. Generally, $XeF_2$ is used for reactive gas etching, and $SF_6$, $CF_4$, and $CHF_3$ are used for reactive ion etching. An applicable plasma generation method can be classified into capacitive coupling, inductive coupling, ECR-RIE, and the like. An exposed incomplete implanted oxide film, which is not a complete silicon oxide film, can be removed by polishing. Alternatively, it is also possible to perform oxidation and heat treatment at a temperature of 600° C. to 1,000° C. for about 1 to 30 minutes so as to produce complete silicon oxides, and then perform removal using an HF solution. Thereby, the CIS epitaxial wafer 10 implanted with the device 151 on the rear side of the epitaxial film 14 (a space sandwiched by the silicon wafer 11; FIG. 9).

For the epitaxial wafer 10 of the first embodiment, the oxygen ion implantation amount is reduced compared with a case of the implanted oxide film of the conventional epitaxial SIMOX wafer ($2.5 \times 10^{17}$ atoms/cm$^2$), as described above. Further, the ion-implanted layer 15 is heat-treated at the time of the epitaxial growth, when the temperature is lower (1,100° C.) than conventional high temperature annealing (1,350° C.).

Thereby, the incomplete implanted oxide film 12 is formed in the surface layer of the silicon wafer 11. Unlike the conventional implanted oxide film sequentially provided with silicon oxides b, the film thickness of the incomplete implanted oxide film 12 thus hardly increases along with oxidation of silicon. Consequently, even when ions are implanted presumptively when particles are deposited on the wafer surface, and thus the oxide film breaks in the wafer surface layer, a pit can be prevented from forming in the wafer surface, and eventually from forming in the surface of the epitaxial film 14 grown on the wafer surface. Thereby, a surface defect of the epitaxial film 14 can be prevented, the surface defect being caused by deposition of particles on the wafer surface at the time of oxygen ion implantation. Further, the oxygen ion implantation amount is less compared with the conventional epitaxial SIMOX wafer, and high temperature annealing is eliminated. Thus, cost can be reduced compared with the epitaxial SIMOX wafer.

In addition, since a temperature distribution in the wafer surface is even, no difference is caused in the growth rate of the epitaxial film 14 in the wafer surface at the time of the epitaxial growth, the difference being between in the area provided with the implanted oxide film 12 and in the remaining area of the external peripheral portion of the wafer. Different from the conventional epitaxial SIMOX wafer, it is thus unlikely that the film thickness increases in the external peripheral portion of the epitaxial film 14, and thereby a slip can be prevented from forming in the external peripheral portion of the wafer. Further, the incomplete implanted oxide film 12 also serves as a gettering site of metal impurities contained in the silicon wafer 11. Thus, the silicon wafer 11 as well as a device can be prevented from metal contamination.

An epitaxial wafer according to a second embodiment of the present invention and a production method of the same are explained below, with reference to FIGS. 10 to 12. As shown in FIGS. 10 to 12, an epitaxial wafer 10A according to the second embodiment of the present invention undergoes a first ion implantation process and a second ion implantation process. The first ion implantation process forms an oxygen ion-implanted layer 17 as a lower layer; the second ion implantation process forms an amorphous layer 18 as an upper layer. The both layers 17 and 18 are integrated at the time of heat treatment, and thus provided as a substantially one-layer incomplete implanted oxide film 12.

The ion-implanted layers 17 and 18 having a two-layer structure are produced as described below. Specifically, the first ion implantation process is first performed, in which oxygen is ion-implanted in a surface layer of a silicon wafer 11 from a wafer surface, at a wafer heating temperature of 400° C., an implantation energy of 216 keV, and an implantation amount of $1.2\times10^{17}$ atoms/cm$^2$. Thereby, the oxygen ion-implanted layer 17 is formed at a depth of 0.5 μm from the surface of the silicon wafer 11 (FIG. 11).

Subsequently, the second ion implantation process is performed on the silicon wafer 11. Specifically, oxygen is ion-implanted in the surface layer of the silicon wafer 11 from the wafer surface, at a wafer heating temperature of 40° C., an implantation energy of 216 keV, and an implantation amount of $4\times10^{15}$ atoms/cm$^2$. Thereby, the amorphous layer 18 is formed at a depth of 0.4 μm from the surface of the silicon wafer 11 (on an upper side of the oxygen ion-implanted layer 17; FIG. 12). Thereafter, the epitaxial growth process of the first embodiment is performed on the silicon wafer 11. Thereby, the substantially one-layer incomplete implanted oxide film 12 having a thickness of 0.2 μm is formed at a depth of 5.3 μm from the wafer surface. The structure above increases the thickness of the incomplete implanted oxide film 12. Other structures, functions, and effects are substantially same as those in the first embodiment, and thus explanations thereof are omitted.

A production method of an epitaxial wafer according to a third embodiment of the present invention is explained below. In the production method of an epitaxial wafer 10 according to the third embodiment of the present invention, a process for implanting oxygen ions in a silicon wafer 11 is performed only once, similar to the first embodiment. Immediately after an epitaxial growth process, an annealing process is performed, in which the silicon wafer 11 is heated under predetermined conditions. Thereby, the incomplete implanted oxide film 12, which was insufficient after the epitaxial growth, turns into the appropriate incomplete implanted oxide film 12 after undergoing the annealing process subsequent to the epitaxial growth.

The epitaxial growth is performed at a heat treatment temperature of 1,150° C. for a heat treatment time of 3.5 minutes. Further, the annealing is performed at a heat treatment temperature of 1,200° C. in 1% oxygen gas atmosphere for a heat treatment time of 30 minutes. As described above, the ion implantation process is performed only once; subsequently, the heat treatment is performed twice; and thereby, the incomplete implanted oxide film 12 is formed. Thus, the epitaxial film having a low oxygen deposition amount and a small surface roughness can be produced. The annealing process subsequent to the epitaxial growth process may be performed immediately prior to the epitaxial growth process under the same annealing conditions. In this case, oxygen deposited in the annealing process serves as a gettering site, thus allowing production of a high quality epitaxial film. Other structures, functions, and effects are substantially the same as those in the first embodiment, and thus explanations thereof are omitted.

A production method of an epitaxial wafer according to a fourth embodiment of the present invention is explained below. In the production method of an epitaxial wafer 10A according to the fourth embodiment of the present invention, a process for implanting oxygen ions in the silicon wafer 11 is performed twice, similar to the second embodiment (the first ion implantation process for forming the oxygen ion-implanted layer 17 and the second ion implantation process for forming the amorphous layer 18). In addition, an annealing process is performed, in which the silicon wafer 11 is heated under predetermined conditions, immediately after an epitaxial growth process.

The epitaxial growth is performed at a heat treatment temperature of 1,150° C. for a heat treatment time of 3.5 minutes. Further, the annealing is performed at a heat treatment temperature of 1,200° C. in argon gas atmosphere for a heat treatment time of 4 hours. As described above, the ion implantation process is performed twice; subsequently, the heat treatment is performed twice; and thereby, the incomplete implanted oxide film 12 is formed. Thus, the epitaxial film having a low oxygen deposition amount and a small surface roughness can be produced. The annealing process subsequent to the epitaxial growth process may be performed immediately prior to the epitaxial growth process under the same annealing conditions. In this case, oxygen deposited in the annealing process serves as a gettering site, thus allowing production of a high quality epitaxial film. Other structures, functions, and effects are substantially the same as those in the second embodiment, and thus explanations thereof are omitted.

INDUSTRIAL APPLICABILITY

The present invention is effective, for example, as a CIS epitaxial wafer.

The invention claimed is:

1. A production method of an epitaxial wafer comprising:
implanting oxygen ions from a surface of a silicon wafer, and thus forming an ion-implanted layer in an area having a depth of 0.05 μm to 0.5 μm from the surface of the silicon wafer at a heating temperature of the silicon wafer of 200° C. or higher with an oxygen ion implantation amount of $1\times10^{15}$ atoms/cm$^2$ to $4\times10^{17}$ atoms/cm$^2$;

growing a silicon epitaxial film on the surface of the silicon wafer immediately after the ion implantation at a temperature of 1,000° C. to 1,200° C. for a period of 1 to 20 minutes; and concurrently heating the wafer in the epitaxial growth, and whereby an incomplete implanted oxide film is formed from the ion-implanted layer, the incomplete implanted oxide film having a predetermined thickness and being mixedly provided with a predetermined ratio of silicon oxides consisting of SiO$_x$ including SiO$_2$, and silicon particles comprising granulated silicon in the silicon wafer produced by the oxygen ion implantation, the incomplete implanted oxide film being intermittently formed in an entire area of the ion-implanted layer, and an active layer is formed on a surface side of the silicon wafer relative to the incomplete implanted oxide film.

2. A production method of an epitaxial wafer comprising:
implanting oxygen ions from a surface of a silicon wafer, and thus forming an ion-implanted layer in an area having a depth of 0.05 μm to 0.5 μm from the surface of the silicon wafer at a heating temperature of the silicon wafer of 200° C. or higher with an oxygen ion implantation amount of $1\times10^{15}$ atoms/cm$^2$ to $4\times10^{17}$ atoms/cm$^2$;

annealing by heat-treating the silicon wafer immediately after the ion implantation at a heating temperature of 900° C. to 1,200° C. for a heating time of 0.5 to 4 hours, and thereby forming from the ion-implanted layer an incomplete implanted oxide film having a predetermined thickness and being mixedly provided with a predetermined ratio of silicon oxides consisting of SiO$_x$ including SiO$_2$, and silicon particles comprising granulated silicon in the silicon wafer produced by the oxygen ion implantation, the incomplete implanted oxide film being formed in an entire area of the ion-implanted layer, and forming an active layer on a surface side of the silicon wafer relative to the incomplete implanted oxide film; and growing a silicon epitaxial film on the surface of the silicon wafer immediately after the annealing.

3. A production method of an epitaxial wafer comprising:
implanting oxygen ions from a surface of a silicon wafer, and thus forming an ion-implanted layer in an area having a depth of 0.05 μm to 0.5 μm from the surface of the silicon wafer at a heating temperature of the silicon wafer of 200° C. or higher with an oxygen ion implantation amount of $1\times10^{15}$ atoms/cm$^2$ to $4\times10^{17}$ atoms/cm$^2$;
growing a silicon epitaxial film on the surface of the silicon wafer immediately after the ion implantation; and
annealing by heat-treating the silicon wafer immediately after the epitaxial growth at a heating temperature of 900° C. to 1,200° C. for a heating time of 0.5 to 4 hours, and thereby forming from the ion-implanted layer an incomplete implanted oxide film having a predetermined thickness and being mixedly provided with a predetermined ratio of silicon oxides consisting of SiO$_x$ including SiO$_2$, and silicon particles comprising granulated silicon in the silicon wafer produced by the oxygen ion implantation, the incomplete implanted oxide film being intermittently formed in an entire area of the ion-implanted layer, and forming an active layer on a surface side of the silicon wafer relative to the incomplete implanted oxide film.

4. A production method of an epitaxial wafer comprising:
firstly implanting oxygen ions from a surface of a silicon wafer, and thus forming an ion-implanted layer in an area having a depth of 0.05 μm to 0.5 μm from the surface of the silicon wafer at a heating temperature of the silicon wafer of 200° C. or higher with an oxygen ion implantation amount of $1\times10^{15}$ atoms/cm$^2$ to $4\times10^{17}$ atoms/cm$^2$;
secondly implanting oxygen ions from the surface of the silicon wafer immediately after the first ion implantation at a heating temperature of the silicon wafer less than 200° C. with an forming an amorphous layer so as to connect to the ion-implanted layer on a surface side of the wafer relative to the ion-implanted layer,
growing a silicon epitaxial film on the surface of the silicon wafer immediately after the second ion implantation at a temperature of 1,000° C. to 1,200° C. for a period of 1 to 20 minutes; and concurrently
heating the wafer in the epitaxial growth, and thereby forming from the ion-implanted layer and the amorphous layer an incomplete implanted oxide film having a predetermined thickness and being mixedly provided with a predetermined ratio of silicon oxides consisting of SiO$_x$ including SiO$_2$, and silicon particles comprising granulated silicon in the silicon wafer produced by the oxygen ion implantation, the incomplete implanted oxide film being intermittently formed in an entire area of the ion-implanted layer and the amorphous layer, and forming an active layer on a surface side of the silicon wafer relative to the incomplete implanted oxide film.

5. A production method of an epitaxial wafer comprising:
firstly implanting oxygen ions from a surface of a silicon wafer, and thus forming an ion-implanted layer in an area having a depth of 0.05 μm to 0.5 μm from the surface of the silicon wafer at a heating temperature of the silicon wafer of 200° C. or higher with an oxygen ion implantation amount of $1\times10^{15}$ atoms/cm$^2$ to $4\times10^{17}$ atoms/cm$^2$;
secondly implanting oxygen ions from the surface of the silicon wafer immediately after the first ion implantation at a heating temperature of the silicon wafer of less than 200° C. with an forming an amorphous layer so as to connect to the ion-implanted layer on a surface side of the wafer relative to the ion-implanted layer; and
annealing by heat-treating the silicon wafer immediately after the second ion implantation at a heating temperature of 900° C. to 1,200° C. for a heating time of 0.5 to 4 hours, and thereby forming from the ion-implanted layer and the amorphous layer an incomplete implanted oxide film having a predetermined thickness and being mixedly provided with a predetermined ratio of silicon oxides consisting of SiO$_x$ including SiO$_2$, and silicon particles comprising granulated silicon in the silicon wafer produced by the oxygen ion implantation, the incomplete implanted oxide film being intermittently formed in an entire area of the ion-implanted layer and the amorphous layer, and forming an active layer on a surface side of the silicon wafer relative to the incomplete implanted oxide film.

6. A production method of an epitaxial wafer comprising:
firstly implanting oxygen ions from a surface of a silicon wafer, and thus forming an ion-implanted layer in an area having a depth of 0.05 μm to 0.5 μm from the surface of the silicon wafer at a heating temperature of the silicon wafer of 200° C. or higher with an oxygen ion implantation amount of $1\times10^{15}$ atoms/cm$^2$ to $4\times10^{17}$ atoms/cm$^2$;
secondly implanting oxygen ions from the surface of the silicon wafer immediately after the first ion implantation at a heating temperature of the silicon wafer less than 200° C. with an oxygen ion implantation amount of $1\times10^{15}$ atoms/cm$^2$ to $4\times10^{16}$ atoms/cm$^2$, thereby forming an amorphous layer so as to connect to the ion-implanted layer on a surface side of the wafer relative to the ion-implanted layer;
growing a silicon epitaxial film on the surface of the silicon wafer immediately after the second ion implantation; and
annealing by heat-treating the silicon wafer immediately after the epitaxial growth at a heating temperature of 900° C. to 1,200° C. for a heating time of 0.5 to 4 hours, and thereby forming from the ion-implanted layer and the amorphous layer an incomplete implanted oxide film having a predetermined thickness and being mixedly provided with a predetermined ratio of silicon oxides consisting of SiO$_x$ including SiO$_2$, and silicon particles comprising granulated silicon in the silicon wafer produced by the oxygen ion implantation, the incomplete implanted oxide film being intermittently formed in an entire area of the ion-implanted layer and the amorphous layer, and forming an active layer on a surface side of the silicon wafer relative to the incomplete implanted oxide film.

* * * * *